United States Patent
Hou (10) Patent No.: US 9,991,153 B2
(45) Date of Patent: Jun. 5, 2018

(54) SUBSTRATE SUPPORT BUSHING

(71) Applicant: Applied Materials, Inc., Santa Clara, CA (US)

(72) Inventor: Tao Hou, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 637 days.

(21) Appl. No.: 14/187,262

(22) Filed: Feb. 22, 2014

(65) Prior Publication Data

US 2014/0265090 A1  Sep. 18, 2014

Related U.S. Application Data (60) Provisional application No. 61/784,210, filed on Mar. 14, 2013.

(51) Int. Cl.
*H01L 21/687* (2006.01)
*H01L 21/67* (2006.01)

(52) U.S. Cl.
CPC .. *H01L 21/68742* (2013.01); *H01L 21/67115* (2013.01); *H01L 21/68785* (2013.01); *H01L 21/68771* (2013.01); *Y10T 16/088* (2015.01)

(58) Field of Classification Search
CPC ......... H01L 21/68742; H01L 21/68785; H01L 21/68728; H01L 21/67051; H01L 21/6719; H01L 21/67115; H01L 21/68771; H01L 21/6751; C23C 16/455; C23C 16/4586
USPC ............... 118/728, 724, 729, 715, 725, 500; 134/157, 33; 396/611; 156/345.51, 156/345.54; 269/296, 14
See application file for complete search history.

(56) References Cited

U.S. PATENT DOCUMENTS

| | | | | |
|---|---|---|---|---|
| 2,508,832 A | * | 5/1950 | McAninch | F16D 1/04 403/355 |
| 3,959,970 A | * | 6/1976 | Bos | B66F 3/42 254/93 H |
| 5,708,556 A | * | 1/1998 | Van Os | C23C 16/4586 361/234 |
| 5,879,128 A | * | 3/1999 | Tietz | H01L 21/68742 414/757 |
| 6,435,798 B1 | * | 8/2002 | Satoh | C23C 16/4586 118/728 |

(Continued)

OTHER PUBLICATIONS

Aluminum Oxide, Al2O3 Ceramic Properties; © 2013 Accuratus.*

*Primary Examiner* — Christopher M Koehler
*Assistant Examiner* — Mahdi H Nejad
(74) *Attorney, Agent, or Firm* — Patterson + Sheridan LLP (57) ABSTRACT

In one embodiment, a substrate support bushing for a lift pin used in a semiconductor processing chamber is provided. The bushing includes an elongated housing sized to guide the lift pin in a substrate support pedestal. The housing has a longitudinal bore formed through the housing. The housing includes at least one passageway slot extending and open to substantially the entire length of the bore. In another embodiment, a method for transferring a substrate from a substrate support pedestal is provided. The method includes displacing a lift pin through a central bore toward a substrate disposed on a substrate support pedestal. The bore has at least one slot extending substantially along and open to the central bore. The method further includes spacing the substrate from the substrate support pedestal on the lift pin.

15 Claims, 7 Drawing Sheets

(56) References Cited

U.S. PATENT DOCUMENTS

| | | | |
|---|---|---|---|
| 6,494,955 B1* | 12/2002 | Lei | C23C 16/45521 118/715 |
| 6,503,562 B1* | 1/2003 | Saito | C23C 8/02 118/715 |
| 6,884,319 B2* | 4/2005 | Kim | C23C 16/4581 118/725 |
| 7,422,655 B2* | 9/2008 | Asakura | H01L 21/68742 118/724 |
| 8,187,414 B2* | 5/2012 | Hardin | C23C 16/4401 118/715 |
| 8,216,422 B2* | 7/2012 | Kurita | B65G 49/061 118/728 |
| 9,218,944 B2* | 12/2015 | Chandrachood | H01J 37/32935 |
| 9,349,589 B2* | 5/2016 | Enomoto | C23C 16/4584 |
| 2003/0075387 A1* | 4/2003 | Wang | C23C 14/50 187/250 |
| 2003/0178145 A1* | 9/2003 | Anderson | C23C 16/4586 156/345.51 |
| 2005/0000449 A1* | 1/2005 | Ishibashi | C23C 16/4585 118/728 |
| 2005/0000450 A1* | 1/2005 | Iizuka | H01L 21/68742 118/728 |
| 2005/0218575 A1* | 10/2005 | Cook | B25B 11/005 269/21 |
| 2006/0156987 A1* | 7/2006 | Lai | C23C 16/4586 118/728 |
| 2007/0089672 A1* | 4/2007 | Shimamura | C23C 8/00 118/504 |
| 2007/0131173 A1* | 6/2007 | Halpin | C23C 16/4586 118/728 |
| 2009/0266840 A1* | 10/2009 | Brand | F04B 13/00 222/1 |
| 2009/0269490 A1* | 10/2009 | Moriyama | C23C 16/4412 427/240 |
| 2010/0083986 A1* | 4/2010 | Kamikawa | H01L 21/67051 134/18 |
| 2010/0101491 A1* | 4/2010 | Aida | H01L 21/68742 118/502 |
| 2010/0225036 A1* | 9/2010 | Zhang | B05B 13/0285 269/58 |
| 2010/0260936 A1* | 10/2010 | Kato | H01L 21/67109 427/255.28 |
| 2011/0155062 A1* | 6/2011 | Kato | C23C 16/45519 118/728 |
| 2013/0101241 A1* | 4/2013 | Hou | C23C 16/4586 384/32 |
| 2013/0344245 A1* | 12/2013 | Xia | C23C 16/4401 427/255.7 |
| 2014/0014318 A1* | 1/2014 | Mail | B66B 9/04 166/77.4 |
| 2014/0050852 A1* | 2/2014 | Umeda | C23C 16/4481 427/255.28 |
| 2014/0175054 A1* | 6/2014 | Carlson | C23C 16/22 216/63 |
| 2014/0202635 A1* | 7/2014 | Yamaguchi | H01J 37/32733 156/345.51 |
| 2014/0265097 A1* | 9/2014 | Cuvalci | H01L 21/00 269/53 |
| 2015/0000599 A1* | 1/2015 | Chen | H01L 21/68742 118/728 |
| 2015/0203965 A1* | 7/2015 | Enomoto | C23C 16/4584 438/758 |
| 2016/0083837 A1* | 3/2016 | Narushima | C23C 16/4408 118/725 |
| 2016/0138375 A1* | 5/2016 | Tanner | E21B 43/128 166/66.4 |

\* cited by examiner

SUBSTRATE SUPPORT BUSHING

CROSS-REFERENCE TO RELATED APPLICATIONS

This application claims priority to U.S. Provisional Patent Application Ser. No. 61/784,210, filed on Mar. 14, 2013, which is incorporated by reference in its entirety.

BACKGROUND OF THE INVENTION

Field of the Invention

Embodiments of the present invention generally relate to a substrate support bushing. More particularly, embodiments of the present invention relate to a substrate support bushing for use with a lift pin in substrate support pedestal.

Description of the Related Art

Thin film transistors have been made on large glass substrates or plates for use in monitors, flat panel displays, solar cells, personal digital assistants (PDA), cell phones, and the like. These transistors are made by sequential deposition of various films including amorphous silicon, both doped and undoped silicon oxides, silicon nitride, and the like in vacuum chambers. The film deposition takes place in a deposition chamber. Within each deposition chamber, the substrate being processed typically rests on a support pedestal situated within the chamber. To facilitate transfer of the substrate between different deposition chambers, support members, such as a plurality of lift pins for example, are extendable through an upper surface of the support pedestal so that the substrate is spaced apart from the support pedestal. This allows a transfer mechanism, such as a robot blade, to slide underneath a back side of the substrate and lift the substrate off the support pedestal without causing damage to either the support pedestal or the substrate.

In conventional deposition chambers, the lift pins are usually housed in a bushing disposed in the support pedestal and have a tendency to bend or tilt in the bushing after repetitive loading and unloading of the substrates. Film deposition may also inadvertently occur on the inside of the bushing since the bushing is exposed to process gasses used during processing of the substrate. The inadvertent film deposited inside the bushing may cause the lift pins to choke during the loading and unloading movement, and damage or break the lift pins. Accordingly, the lift pins are and bushings must be regularly replaced after periods of use, causing down time for removing the damaged pins and installing the replacements.

Therefore, there is a need for a method and apparatus that increases the longevity of bushings and lift pins.

SUMMARY OF THE INVENTION

The present invention generally relates to a substrate support bushing. More particularly, embodiments of the present invention relate to a substrate support bushing for use with a lift pin in a substrate support pedestal. In one embodiment, a substrate support bushing for a lift pin used in a semiconductor processing chamber is provided. The bushing includes an elongated housing that is sized to guide the lift pin in a substrate support pedestal. The bushing has a longitudinal bore formed through the housing. The housing includes at least one passageway slot extending and open to substantially the entire length of the bore.

In another embodiment, a method for transferring a substrate from a substrate support pedestal is provided. The method includes displacing a lift pin through a central bore toward a substrate disposed on a substrate support pedestal. The bore has at least one slot extending substantially along and open to the central bore. The method further includes spacing the substrate from the substrate support pedestal on the lift pin.

In a yet another embodiment, a processing chamber is provided. The processing chamber includes a chamber body having a substrate support pedestal disposed therein, and two or more support bushings. The two or more support members are each disposed on an upper surface of the support pedestal. The support members comprise a housing having a bore formed therethrough. The bore includes a plurality of passageway slots that are extending and open to substantially the entire length of the bore. The bore also includes a lift pin disposed in the bore, and a clearance configured to allow the lift pin to move axially through the bore between a first and second end of the bore. The plurality of passageway slots circumscribe the clearance.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
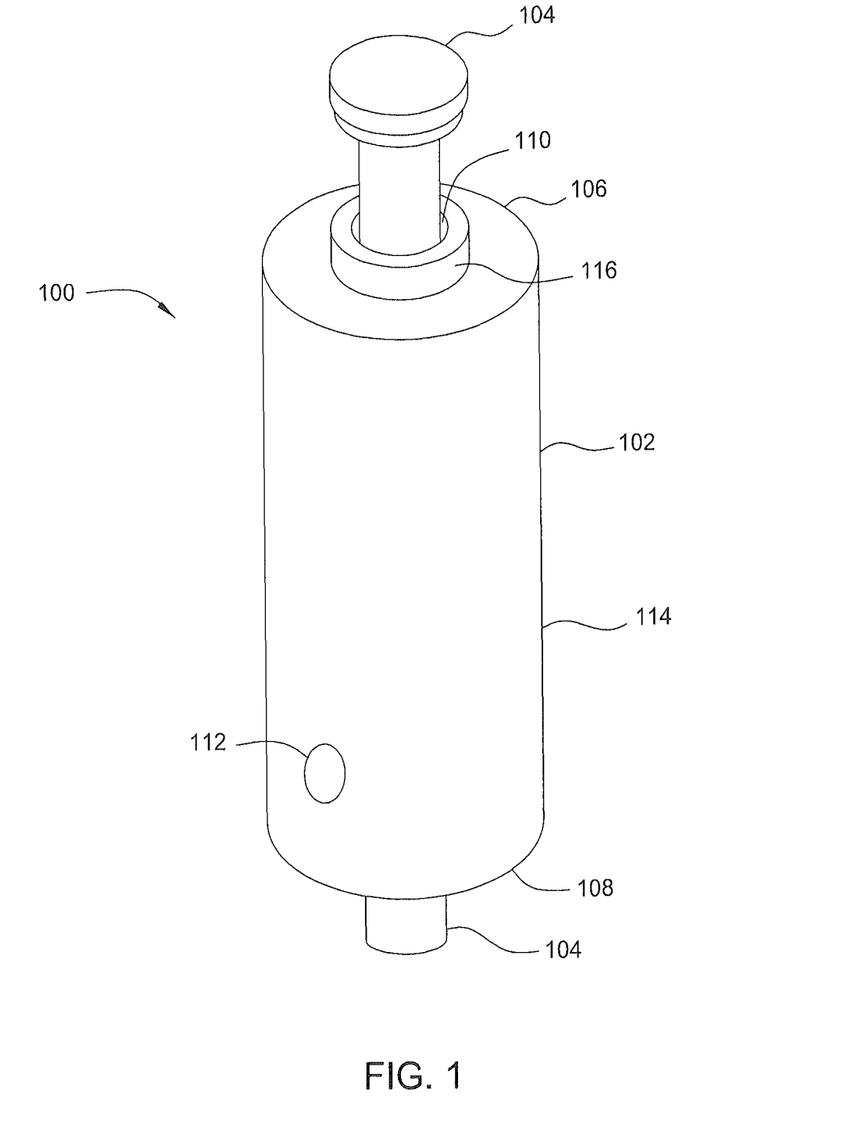
FIG. 1 is a schematic perspective view of one embodiment of a support member having a bushing and lift pin.

FIG. 1 is a schematic perspective view of one embodiment of a support member 100. The support member 100 includes a bushing 102 and a lift pin 104 disposed therethrough. At a first end 106 of the support member 100, a substrate (not shown), such as any semiconductor substrate including a flat panel display, round wafer, liquid crystal display, glass panel substrate, plastic substrate, and the like, may be supported on the lift pin 104. At a second end 108 of the support member 100, the support member 100 may be coupled to a support pedestal, susceptor, robot blade, shelf, or other member adapted to hold or support a substrate thereon.

In one embodiment, the bushing 102 is cylindrical. The bushing 102 has an annular elongated body 114 having a central bore 110 and a cross hole 112 formed at least partially therethrough. The body 114 may be fabricated from a metal, plastic or other suitable material. In one embodiment, the body 114 is fabricated from ceramic, or a material having a low coefficient of thermal expansion in the range of about 0 μin/in-° F. to about 15.5 μin/in-° F., or other materials suitable for high temperature processes. For example, the body 114 may be used in processes requiring high temperatures ranging from between about 400 degrees Celsius to about 1500 degrees Celsius. In one embodiment, the body 114 is fabricated from, but is not limited to, aluminum oxide ($Al_2O_3$), aluminum nitride (AlN), zirconium oxide ($ZrO_2$), quartz ($SiO_2$), yttrium oxide ($Y_2O_3$), Inconel and the like. In another embodiment, the body 114 may be fabricated from a material having a coefficient of thermal expansion that is complementary to the coefficient of thermal expansion of the lift pin 104. For example, the body 114 and the lift pin 104 may have the same coefficient of thermal expansion or a coefficient of thermal expansion less than 15 μin/in-° F.

The central bore 110 extends longitudinally completely through the body 114, from the first end 106 to the second end 108 of the support member 100, and is configured to house the lift pin 104 as shown in FIG. 1. The central bore 110 does not need be round as long as it functions as a guide for actual displacement of the lift pin 104 through the housing 102. In one embodiment, the bushing 102 also includes a flange 116 disposed about the first end 106. The flange 116 is configured to serve as a shoulder or stop against the lift pin 104 when the pin 104 is in a retracted position and may also be used to locate the support member 100 within another structure, such as a support pedestal.

The cross hole 112 extends into the body 114 and fluidly connects (i.e., intersects) the central bore 110. The cross hole 112 may extend completely through the body 114. Although the cross hole 112 is shown disposed at the second end 108 of the body 114, it is contemplated that the cross hole 112 may be located at the first end 106 or other suitable location. The cross hole 112 is configured to perform one or more of the following functions: allow process and other gases present in the central bore 110 to be rapidly pumped out, allow inert or cleaning gases to be pumped into the central bore 110, and accommodate gas displacement to allow quicker and freer movement of the lift pin 104 within the bushing 102. The central bore 110 and the cross hole 112 will be described further in detail in reference to FIGS. 3A-3E.

Figure 2:
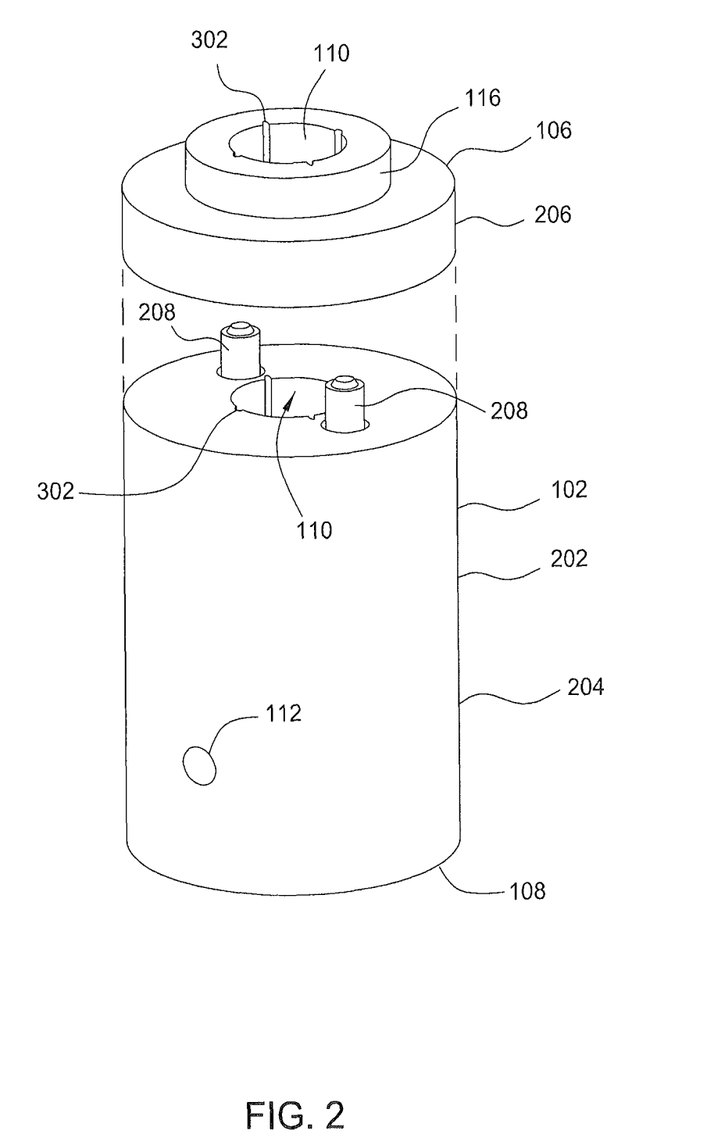
FIG. 2 an exploded view of one embodiment of a bushing.

FIG. 2 illustrates an exploded view of another embodiment of the bushing 102. The bushing 102 has an annular body 202 and may be fabricated from any of the materials listed above in reference to the bushing body 114. The body 202 may be formed from two or more sections, i.e., not a unitary structure. For example, in the embodiment shown in FIG. 2, the annular body 202 includes a bottom section 204 and a top section 206 coupled together by one or more connecting structures 208, such that the connecting structures 208 are hidden and not seen from an exterior view of the annular body 202. The connecting structures 208 may be dowel pins, spring pins, retaining rings or other suitable structures configured to couple the sections 204, 206 together. In the embodiment depicted in FIG. 2, the connecting structures 208 include dowel pins force fit into blind holes formed in opposing faces of the sections 204, 206. Forming the body 202 from two or more pieces is advantageous during manufacturing. For example, in embodiments where the bushing 102 is small, forming the body 202 from two or more sections minimizes potential breakage associated with machining a bushing from a long unitary structure. Thus, a higher throughput is achieved in manufacturing a bushing from two or more sections 204, 206.

Figure 3A:
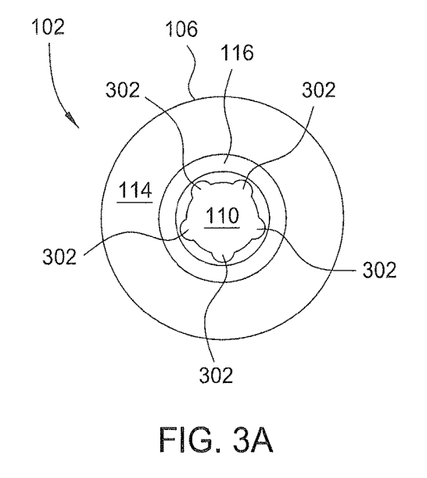
FIG. 3A is a top view of one embodiment of a bushing.
Figure 3B:
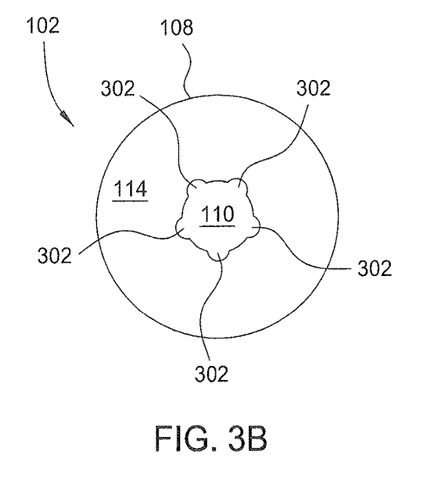
FIG. 3B is a bottom view of the bushing shown in FIG. 3A.
Figure 3C:
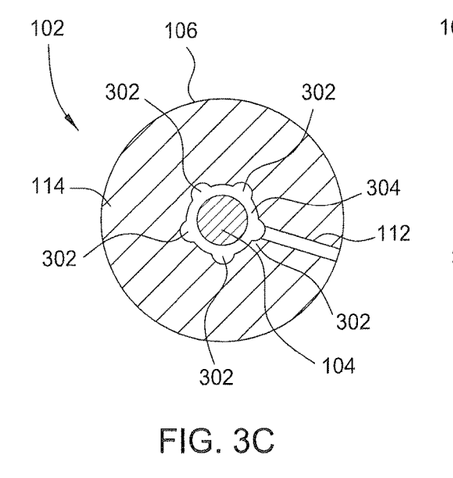
FIG. 3C is a sectional view of the bushing shown in FIG. 3A with a lift pin disposed therein.
Figure 3D:
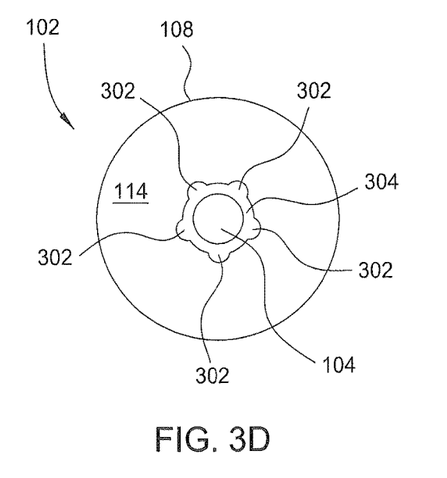
FIG. 3D is a bottom view of the bushing shown in FIG. 3B with a lift pin disposed therein.

FIGS. 3A and 3B are top and bottom views respectively of one embodiment of the bushing 102, shown without the lift pin 104. FIG. 3C is a sectional view of the bushing 102 through the cross hole 112 with the lift pin 104, and FIG. 3D is a bottom view of the bushing 102 with the lift pin 104. The central bore 110 has a cylindrical shape and is configured to guide the movement of the lift pin 104 (as illustrated in FIGS. 3C and 3D) within the bushing 102. The central bore 110 is sized to allow a clearance 304 between the pin 104 and bushing 102, and a plurality of fluid passageway slots 302 formed into the body 114 and extending substantially the length of the central bore 110. The lift pin clearance 304 is configured to allow the lift pin 104 to move axially through the central bore 110 between the first and second ends 106, 108, without bending radially outward but fluidly open to the central bore 110.

The passageway slots 302 are formed in the body 114 and the clearance 304. In one embodiment, the total area of the passageway slots 302 is about 2% to about 20% of the cross-sectional area of the central bore 110. The passageway slots 302 are configured to allow fluid, such as gas present in the central bore 110 to be unrestricted by the clearance 304 and easily displaced within the central bore 110 so as not to restrict the movement of the lift pin 104. Having the slot 302 run the entire length of the housing 102 allows gas to flow through and escape in the central bore 110. This advantageously prevents process gas from depositing film in the clearance 304 and choking the clearance and movement of the lift pin 104 therethrough. Therefore, the passageway slots 302 function to increase the service life of the bushing 102 by reducing the amount of film deposited therein and while decreasing the likelihood that the lift pin 104 may break due to choking.

The cross hole 112 intersects at least one of the central bore 110 and slots 302. The cross hole 112 is configured to vent fluid flowing through the bushing 102. The cross hole 112 advantageously allows fluid, such as air molecules in the bushing 102, to evacuate quickly from the body 114, for example, when a processing chamber using the bushing 102 is being evacuated. In yet another embodiment, the cross hole 112 may be used as an entry point so as to flood inert or cleaning gases into the central bore 110 to clean the passageway slots 302 and the clearance 304.

The support member 100 described herein is suitable for use in testing chambers, semiconductor processing chambers, or systems that requires support of a substrate. For example, the bushing 102 is particularly useful within a deposition chamber, such as a chemical vapor deposition (CVD) chamber, plasma enhanced chemical vapor deposition (PECVD) chamber, a physical vapor deposition (PVD) chamber, etch chamber or other vacuum chamber used for vacuum processing. For clarity and ease of description, a PECVD chamber utilizing the bushing 102 described herein is described below with reference to FIGS. 4-7.

Figure 4:
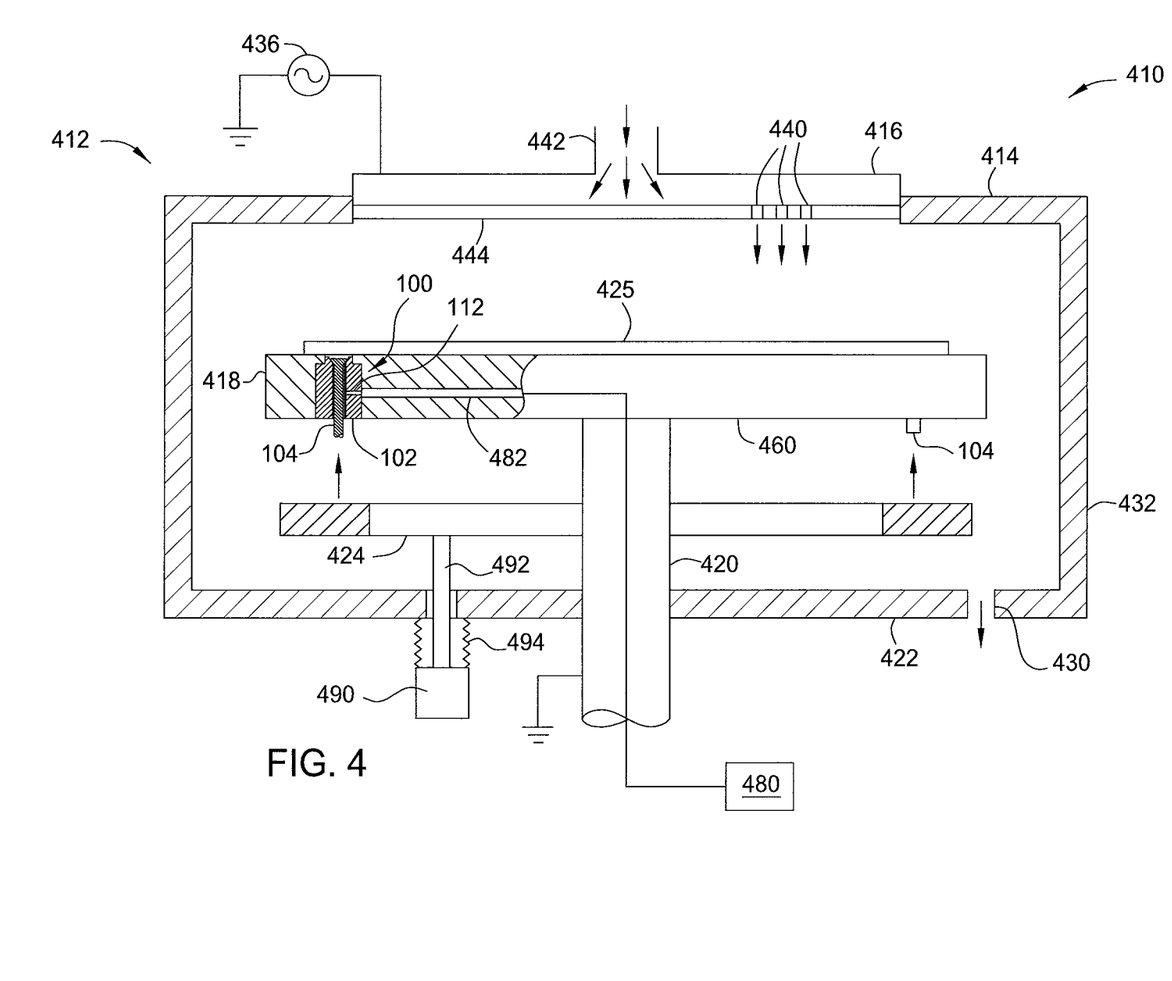
FIG. 4 is a schematic sectional view of an plasma enhanced chemical vapor deposition chamber utilizing a support member disposed in a support pedestal.

FIG. 4 shows a schematic sectional view of a PECVD chamber 410. The PECVD chamber 410 includes a chamber body 412 having an opening formed through a top wall 414 and a gas inlet manifold 416 disposed within the opening. Alternatively, the top wall 414 can be solid and the gas inlet manifold 416 is located adjacent an inner surface thereof. The gas inlet manifold 416 may serve as an electrode and in one embodiment, is connected to a power source 436, such as a RF power source through a match network (not shown).

A support pedestal 418 is disposed within the chamber body 412. The support pedestal 418 has a plate-like form and extends parallel to the gas inlet manifold 416. The support pedestal 418 is typically made of aluminum and may be coated with a layer of aluminum oxide. The support pedestal 418 is connected to ground and serves as a second electrode so as to connect the power source 436 across the gas inlet manifold 416 and the support pedestal 418.

The support pedestal 418 is mounted on the end of a shaft 420 which extends vertically through a bottom wall 422 of the chamber body 412. The shaft 420 is movable so as to permit the movement of the support pedestal 418 vertically up and down within the chamber body 412. Two or more of the support members 100, described above, are disposed in the support pedestal 418 to, when activated, space a substrate 425 from the support pedestal 418, to facilitate robotic transfer. While there are only two support members 100 shown, any number of support members 100 may be arranged about the support pedestal 418. The number and arrangement of the support members 100 depend on the shape and size of the substrate 425 to be processed as well as the process performed with the chamber 410. In one aspect, each support member 100 is identical. In another aspect, some support members 100 may be different than other support members 100, for example, by having different length lift pins 104.

Still referring to FIG. 4, the chamber 410 further includes a gas outlet 430 extending through the chamber body 412. The gas outlet 430 is connected to a pump (not shown) for evacuating gases from the chamber body 412. A gas inlet conduit 442 is in fluid communication with the gas inlet manifold 416, and is connected to a gas panel (not shown) that includes sources (not shown) of various gases. Process gases flow via the inlet conduit 442 through a showerhead 444, and into the chamber body 412. The showerhead 444 includes a plurality of apertures 440 formed therethrough to evenly distribute the gases across the surface of the substrate 425 to be processed below.

The PECVD chamber 410 includes a lift ring 424 coupled by a shaft 492 to a lift actuator 490 to facilitate displacement of the lift pins 104 that space the substrate 425 on and off the support pedestal 418. The lift ring 424 extends horizontally between the support pedestal 418 and the bottom wall 422 of the chamber body 412. The lift ring 424 is substantially parallel to the support pedestal 418 and is vertically movable via the actuator 490. A bellows 494 is provided between the lift actuator 490 and chamber body 412 to prevent leakage.

Figure 5:
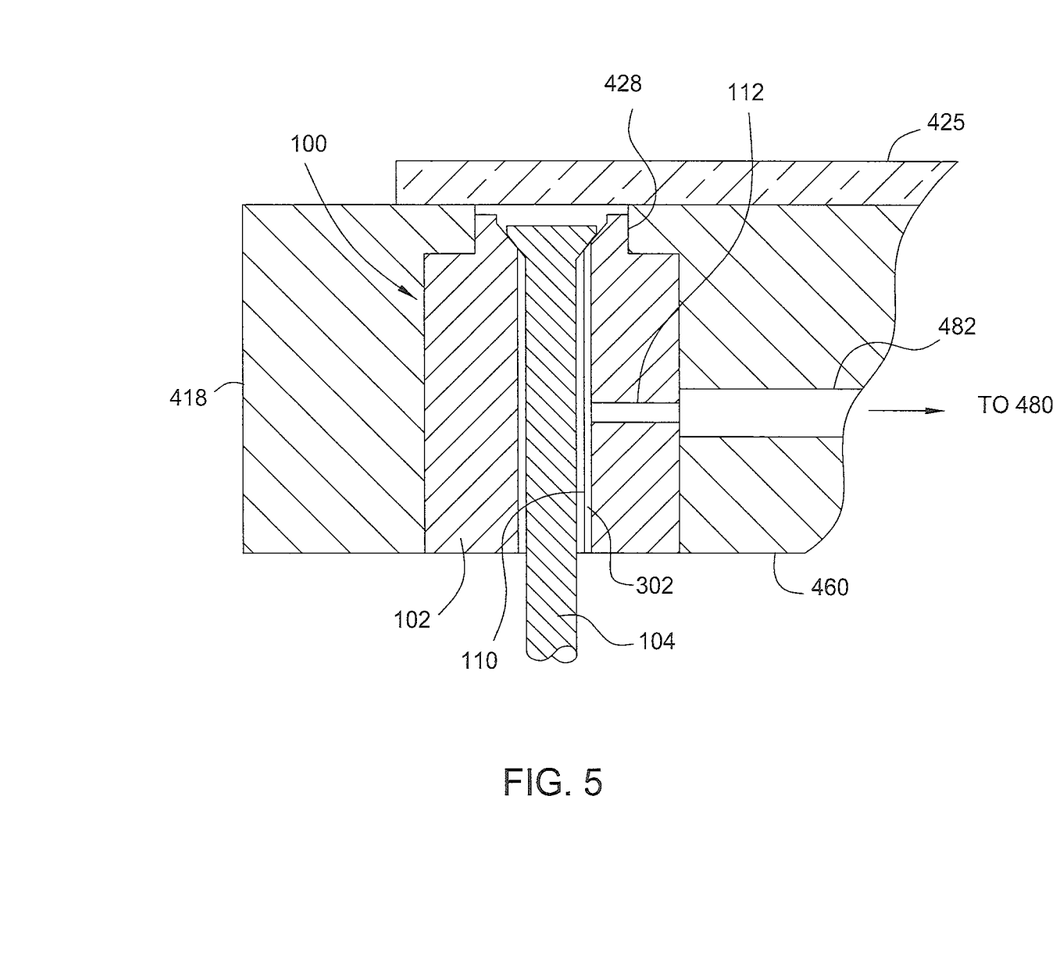
FIG. 5 is a partial sectional view of support pedestal of FIG. 4 detailing the support member.

Referring additionally to the partial sectional view of the support pedestal 418 illustrated in FIG. 5, the lift pins 104 of the support members 100 are positioned to extend through lift holes 428 formed through the pedestal 418. The lower ends of the lift pins 104 extend below a bottom 460 of the pedestal 418 to allow displacement by the lift ring.

To further enhance the ability of the lift pin 104 to move through the lift holes 428, the cross hole 112 may be fluidly coupled to a vacuum or gas source 480 via a passage 482 formed through the pedestal 418. When configured as a vacuum source, the source 480 may be utilized to remove residual gases from the central bore 110. In some embodiments, the cross hole 112 may be coupled to the slot 302 to more effectively remove gases from the entire bore 112 bore 110. When configured as a gas source, the source 480 may provide an inert purge gas which floods the central bore 110, thereby preventing process gas from entering the central bore 110 and potentially leaving deposited material within the bore 110 or on the pin 104 which could detrimentally affect the ability of the pin 104 to travel within the bore 110 and extend through the lift holes 428.

Figure 6:
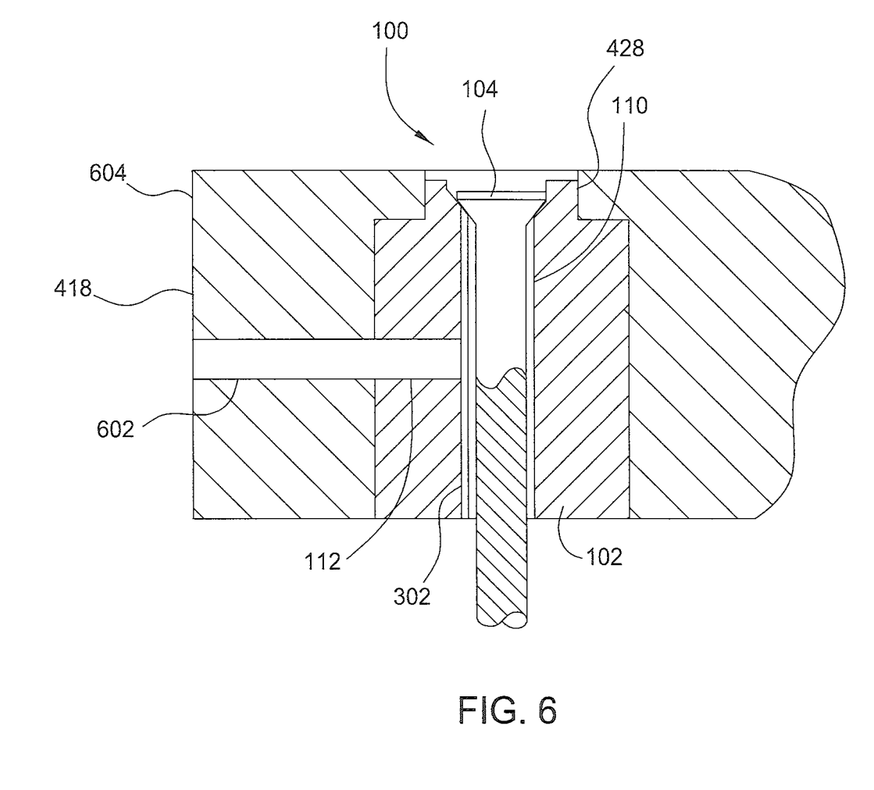
FIG. 6 is a partial sectional view of another embodiment of a support pedestal of FIG. 4 wherein the support member is vented through the support pedestal.

FIG. 6 shows another embodiment of a partial sectional view of the support pedestal 418. In the embodiment depicted in FIG. 6, the cross hole 112 of the support member 100 is aligned with a vent hole 602 formed through the pedestal 418. The vent hole 602 may exit a side 604 of the pedestal 418 to allow gases to be readily displaced from the central bore 110 as the lift pin 104 moves, thereby allowing more freer movement of the lift pin 104 which minimizes potential breakage.

Figure 7:
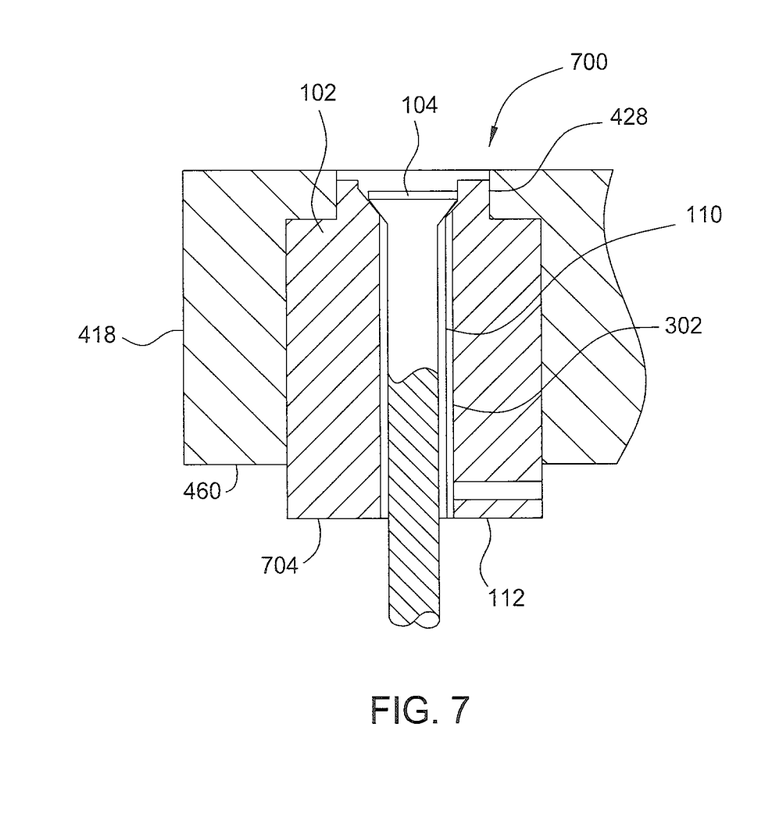
FIG. 7 is a partial sectional view of yet another embodiment of a support pedestal having the support member vented below the support pedestal.

FIG. 7 is a partial sectional view of another support member 700 that may be used in a support pedestal 418. The support member 700 is substantially identical to the support members 100 described above, except wherein a lower end 704 of the support members 700 extend beyond a lower side 460 of the support pedestal 418. As the support members 100 extend below the bottom 460 of the support pedestal 418, the central bore 110 is correspondingly lower which results in a longer bearing surface for the lift pins 104. The longer bearing surface reduces the probability of a lift pin breakage and binding.

In one aspect of this embodiment, the cross hole 112 is located toward the lower end 704 of the support member 100 and below the support pedestal 418. As discussed above, fluid may be vented out of the support members 100 through the cross hole 112 directly into the chamber without having an exit channel formed in the support pedestal 418. Since the cross hole 112 is directly exposed to the chamber, fluid may be more easily vented out from the support member 100, thereby allowing freer movement of the lift pin 104.

While the foregoing is directed to embodiments of the present invention, other and further embodiments of the invention may be devised without departing from the basic scope thereof, and the scope thereof is determined by the claims that follow.

What is claimed is:

1. A substrate support bushing for a lift pin used in a semiconductor processing chamber, comprising:
   an elongated housing sized to guide the lift pin in a substrate support pedestal having a passage formed therein, the housing, comprising:
   a longitudinal bore formed through the housing;
   a plurality of passageway slots extending and open to substantially an entire length of the bore;
   a cross hole intersecting the bore, the cross hole continually providing communication between the bore and an exterior of the bushing, and wherein the cross hole is configured to be directly open to the passage formed in the substrate support pedestal; and
   a flange disposed about a first end of the elongated housing, the flange having an outer diameter less than an outer diameter of the elongated housing.

2. The substrate support bushing of claim 1, wherein the lift pin is disposed in the bore.

3. The substrate support bushing of claim 2, wherein the housing comprises:
   a clearance configured to allow the lift pin to move axially through the bore between a first and second end of the bore, wherein a passageway slot of the at least one passageway slot circumscribes the clearance.

4. The substrate support bushing of claim 1, wherein the housing is fabricated from two or more sections, and wherein the two or more sections are coupled together by one or more connecting structures such that the connecting structures are hidden from an exterior view of the housing.

5. The substrate support bushing of claim 1, wherein the housing is fabricated from aluminum oxide ($Al_2O_3$), aluminum nitride (AlN), zirconium oxide ($ZrO2$), quartz ($SiO2$), yttrium oxide ($Y2O3$), or Inconel.

6. The substrate support bushing of claim 1, wherein the housing is fabricated from a material having a coefficient of thermal expansion between about 0 μin/in-° F. to about 15.5 μin/in-° F.

7. The substrate support bushing of claim 1, wherein a total area of a passageway slot from the at least one passageway slot is about 2% to about 20% of a cross-sectional area of the bore.

8. A method for transferring a substrate from a support pedestal, comprising:
displacing a lift pin through a central bore toward a substrate disposed on a substrate support pedestal having a passage formed therein, the bore having a plurality of passageway slots extending substantially along and open to the central bore;
spacing the substrate from the substrate support pedestal on the lift pin; and
flowing a gas into the bore through a cross hole intersecting the bore, the cross hole configured to be directly open to the passage formed in the substrate support pedestal; and
applying a vacuum to the bore through a second cross hole radially intersecting the bore.

9. The method of claim 8, further comprising:
venting the gas in the bore through a second cross hole intersecting the bore.

10. A processing chamber comprising:
a chamber body having a substrate support pedestal disposed therein, the substrate support pedestal having a passage formed therein; and
two or more support bushings each disposed on an upper surface of the substrate support pedestal, wherein each support bushing comprises:
a housing having a bore formed therethrough, wherein the bore comprises:
a plurality of passageway slots extending and open to substantially an entire length of the bore;
a lift pin disposed in the bore;
a flange disposed on one end of the housing, and configured to stop movement of the lift pin when the lift pin is in a retracted position, the flange having an outer diameter less than an outer diameter of the housing; and
a clearance configured to allow the lift pin to move axially through the bore between a first and second end of the bore, wherein the plurality of passageway slots circumscribe the clearance; and
a cross hole formed in the housing and intersecting the bore, wherein the cross hole is configured to be fluidly coupled to a vacuum or gas source via the passage formed in the support pedestal, wherein the cross hole is configured to be directly open to the passage formed in the substrate support pedestal, and wherein the cross hole intersects the plurality of passageway slots.

11. The processing chamber of claim 10, wherein the processing chamber further comprises:
a vent hole formed laterally through and on a side of the support pedestal; and
a second cross hole formed in the housing of each support bushing and intersecting the bore, wherein the second cross hole is aligned with the vent hole.

12. The processing chamber of claim 10, wherein each support bushing further comprises:
a second cross hole formed in the housing and intersecting the bore, wherein the second cross hole extends below the support pedestal.

13. The processing chamber of claim 10, wherein a total area of the plurality of passageway slots is about 2% to about 20% of a cross-sectional area of the bore.

14. The processing chamber of claim 10, wherein the housing each support bushing is fabricated from a material having a coefficient of thermal expansion between about 0 μin/in-° F. to about 15.5 μin/in-° F.

15. The processing chamber of claim 10, wherein the chamber body comprises a lift ring extending horizontally between the support pedestal and a bottom wall of the chamber body, and substantially parallel to the support pedestal, wherein the lift ring is positionable to displace the lift pin.

* * * * *